United States Patent
Hussell et al.

(10) Patent No.: US 8,547,009 B2
(45) Date of Patent: Oct. 1, 2013

(54) LIGHTING STRUCTURES INCLUDING DIFFUSER PARTICLES COMPRISING PHOSPHOR HOST MATERIALS

(75) Inventors: Christopher P. Hussell, Cary, NC (US); Brian Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 127 days.

(21) Appl. No.: 12/500,679

(22) Filed: Jul. 10, 2009

(65) Prior Publication Data

US 2011/0006668 A1  Jan. 13, 2011

(51) Int. Cl.
*H01J 1/62* (2006.01)
*H01L 33/00* (2010.01)

(52) U.S. Cl.
USPC .............. 313/499; 313/501; 313/502; 257/98

(58) Field of Classification Search
USPC ............................ 313/499, 501–502; 257/98
See application file for complete search history.

(56) References Cited

U.S. PATENT DOCUMENTS

| | | |
|---|---|---|
| 7,045,078 B2 | 5/2006 | Choi |
| 2002/0039001 A1* | 4/2002 | Nagai et al. ................... 313/512 |
| 2002/0093287 A1* | 7/2002 | Chen ............................. 313/512 |
| 2003/0038596 A1 | 2/2003 | Ho |
| 2003/0132701 A1* | 7/2003 | Sato et al. ..................... 313/503 |
| 2005/0057144 A1 | 3/2005 | Morita et al. |
| 2006/0022215 A1 | 2/2006 | Arndt et al. |
| 2007/0045644 A1 | 3/2007 | Han et al. |
| 2007/0052342 A1* | 3/2007 | Masuda et al. ................ 313/487 |
| 2007/0262339 A1 | 11/2007 | Hussell et al. |
| 2007/0274068 A1* | 11/2007 | Berben et al. ................. 362/231 |
| 2008/0054279 A1 | 3/2008 | Hussell et al. |
| 2008/0054284 A1 | 3/2008 | Hussell et al. |
| 2008/0094829 A1 | 4/2008 | Narendran et al. |
| 2008/0116467 A1* | 5/2008 | Mueller et al. ................... 257/89 |
| 2008/0149956 A1* | 6/2008 | Mueller-Mach et al. ....... 257/98 |
| 2008/0149958 A1 | 6/2008 | Reeh et al. |
| 2008/0173883 A1 | 7/2008 | Hussell et al. |
| 2008/0218072 A1 | 9/2008 | Haruna et al. |
| 2008/0230796 A1* | 9/2008 | Ho et al. ........................ 257/98 |
| 2008/0231170 A1* | 9/2008 | Masato et al. ................ 313/501 |
| 2009/0001407 A1* | 1/2009 | Osawa et al. .................. 257/99 |
| 2009/0294788 A1* | 12/2009 | Rosler et al. .................... 257/98 |

FOREIGN PATENT DOCUMENTS

JP  2008-103599  5/2008

OTHER PUBLICATIONS

"Visible Spectrum" retrieved from http://en.wikipedia.org/wiki/Visible_spectrum pp. 1-5, retrieved May 22, 2009.
"The Electromagnetic Spectrum" retrieved from http://science.hg.nasa.gov/kids/imagers/ems/visible.html; pp. 1-4, retrieved May 22, 2009.

(Continued)

*Primary Examiner* — Anh Mai
*Assistant Examiner* — Michael Santonocito
(74) *Attorney, Agent, or Firm* — Myers Bigel Sibley & Sajovec, P.A.

(57) ABSTRACT

A lighting structure may include a semiconductor light emitting device configured to generate light responsive to an electrical signal applied thereto. In addition, an encapsulating material may be configured to transmit light generated by the semiconductor light emitting device, and the encapsulating material may include yttrium aluminum garnet (YAG) diffuser particles and phosphor particles therein. More particularly, the yttrium aluminum garnet (YAG) diffuser particles and the phosphor particles may have different compositions.

26 Claims, 3 Drawing Sheets

(56) References Cited

OTHER PUBLICATIONS

Biwas et al. "$Pr^{3+}$ Activated Silica Phosphor Glasses by Sol-Gel Method" *Materials Research Bulletin*, 32(11):1551-1557 (1997) Abstract, retrieved from http://cat.inist.fr/?aModele=afficheN&cpsidt=2063372, 1 page, retrieved May 21, 2009.

"Electroluminescent Oxide Phosphor Thin Films Prepared by Sol-gel Process" retrieved from http://www.mrs.org/s_mrs/sec_subscribe.asp?CID=2367&DID=180860&action=detail 1 page, retrieved May 21, 2009.

Hirata et al. "Luminescence study in Eu-doped aluminum oxide phosphors" *Opitcal Materials* 27:1311-1315 (2005).

Miyata et al. "Gallium oxide as host material for multicolor emitting phosphors" retrieved from http://www.sciencedirect.com/science?_ob=ArticleURL&_udi=B6TJH-403W4XG-DR& . . . , pp. 1-2, retrieved May 21, 2009, available online Apr. 24, 2000.

Weatherspoon et al. "Phosphor Microparticles of Controlled Three-Dimensional Shape from Phytoplankton" *J. Electrochem Soc.* 153(2):H34-H37 (2006), Abstract.

Zimmerman "The Visible Light Spectrum" retrieved from http://physics.about.com/od/lightoptics/a/vislightspec.htm, pp. 1-2, retrieved May 22, 2009.

International Search Report for International Application No. PCT/US2010/0410256, mailed Nov. 19, 2010.

Notification of Transmittal of the International Preliminary Report on Patentability corresponding to PCT Application No. PCT/US2010/041026, Date of Mailing: Sep. 23, 2011.

Japanese Office Action, corresponding to JP Application No. 2012-519657, Jun. 26, 2013.

\* cited by examiner

US 8,547,009 B2

LIGHTING STRUCTURES INCLUDING DIFFUSER PARTICLES COMPRISING PHOSPHOR HOST MATERIALS

FIELD OF THE INVENTION

This invention relates to semiconductor light emitting devices, and more particularly to diffusers for semiconductor light emitting devices.

BACKGROUND

A blue light emitting diode may be configured to provide substantially white light by providing a yellow phosphor to convert a portion of the blue light to yellow light. The resulting blue and yellow light may mix to provide substantially white light. A diffuser may be provided to enhance color mixing and to thereby provide a more uniformly white light. Known diffusers include barium titanate, titanium dioxide, aluminum oxide, silicon dioxide, and silica.

SUMMARY

According to some embodiments of the present invention, a lighting structure may include a semiconductor light emitting device configured to generate light responsive to an electrical signal applied thereto. An encapsulating material may be configured to transmit light generated by the semiconductor light emitting device with the encapsulating material including luminescent phosphor particles and non-luminescent diffuser particles therein. The phosphor particles may include a phosphor host material doped with a luminescent activator, and the non-luminescent diffuser particles may include the phosphor host material.

Moreover, the phosphor host material may include at least one of $(Ba,Sr,Ca)_5(PO_4)_3(Cl,F,Br,OH)$; $(Ba,Sr,Ca)BPO_5$; $(Sr,Ca)_{10}(PO_4)_6*\upsilon B_2O_3$ wherein $0<\upsilon\leq1$); $Sr_2Si_3O_8*2SrCl_2$; $(Ca,Sr,Ba)_3MgSi_2O_8$; $BaAl_8O_{13}$; $2SrO*0.84P_2O_5*0.16B_2O_3$; $(Ba,Sr,Ca)MgAl_{10}O_{17}$; $(Ba,Sr,Ca)Al_2O_4$; $(Y,Gd,Lu,Sc,La)BO_3$; $(Ba,Sr,Ca)_2Si_{1-\xi}O_{4-2\xi}$ (wherein $0\leq\xi\leq0.2$); $(Ba,Sr,Ca)_2(Mg,Zn)Si_2O_7$; $(Sr,Ca,Ba)(Al,Ga,In)_2S_4$; $(Y,Gd,Tb,La,Sm,Pr,Lu)_3(Al,Ga)_{5-\lambda}O_{12-3/2\lambda}$ (wherein $0\leq\lambda\leq0.5$); $(Lu,Y,Sc)_{2-\rho}(Ca,Mg)_{1+\rho}Li_\sigma Mg_{2-\sigma}(Si-,Ge)_{3-o}P_oO_{12-\rho}$ (wherein $0\leq\rho\leq0.5$, $0\leq\sigma\leq0.5$); $(Ca,Sr)_8(Mg,Zn)(SiO_4)_4Cl_2$; $Na_2Gd_2B_2O_7$; $(Sr,Ca,Ba,Mg,Zn)_2P_2O_7$; $(Gd,Y,Lu,La)_2O_3$; $(Gd,Y,Lu,La)_2O_2S$; $(Gd,Y,Lu,La)VO_4$; $(Ca,Sr)S$; $SrY_2S_4$; $CaLa_2S_4$; $(Ba,Sr,Ca)MgP_2O_7$; $(Y,Lu)_2WO_6$; $(Ba,Sr,Ca)_\beta Si_\gamma N_\mu$ (wherein $2\beta+4\gamma=3\mu$); $Ca_3(SiO_4)Cl_2$; $(Y,Lu,Gd)_{2-\phi}Ca_\phi Si_4N_{6+\phi}C_{1-\phi}$ (wherein $0\leq\phi\leq0.5$); $(Lu,Ca,Li,Mg,Y)\alpha$-SiAlON; and/or $3.5MgO*0.5MgF_2*GeO_2$. The phosphor particles may be cerium doped yttrium aluminum garnet (YAG:Ce) phosphor particles, and the non-luminescent diffuser particles may include non-luminescent yttrium aluminum garnet (YAG) diffuser particles (e.g., substantially undoped YAG diffuser particles).

The non-luminescent diffuser particles may be distributed throughout the encapsulating material. In another embodiment, a first concentration of the non-luminescent diffuser particles adjacent the semiconductor light emitting device may be greater than a second concentration of the non-luminescent diffuser particles more distant from the semiconductor light emitting device. In yet another embodiment, the encapsulating material may include a first layer of encapsulating material including the luminescent phosphor particles, and a second layer of encapsulating material including the non-luminescent diffuser particles, with the second layer of encapsulating material being substantially free of the luminescent phosphor particles.

The non-luminescent diffuser particles may include substantially spherical non-luminescent diffuser particles. Each of the non-luminescent diffuser particles may have a width less than about 50 µm (micrometer), and more particularly, each of the non-luminescent diffuser particles may have a width in the range of about 2 µm (micrometer) to about 25 µm (micrometer). Moreover, each of the non-luminescent diffuser particles may have a refractive index of at least about 1.8. The encapsulating material may include at least one of an epoxy, a resin, a silicone, and/or a plastic, and may have a refractive index of no more than about 1.6.

According to some other embodiments of the present invention, a lighting structure may include a semiconductor light emitting device configured to generate light responsive to an electrical signal applied thereto. In addition, an encapsulating material may be configured to transmit light generated by the semiconductor light emitting device, and the encapsulating material may include phosphor particles and yttrium aluminum garnet (YAG) diffuser particles therein. More particularly, the phosphor particles and the yttrium aluminum garnet (YAG) diffuser particles may have different compositions.

The phosphor particles may be luminescent doped yttrium aluminum garnet (YAG) phosphor particles such as luminescent cerium doped yttrium aluminum garnet (YAG:Ce) phosphor particles. The yttrium aluminum garnet (YAG) diffuser particles may be substantially non-luminescent yttrium aluminum garnet (YAG) diffuser particles such as substantially undoped yttrium aluminum garnet (YAG) diffuser particles. Moreover, the yttrium aluminum garnet (YAG) diffuser particles may be distributed throughout the encapsulating material.

A first concentration of the yttrium aluminum garnet (YAG) diffuser particles adjacent the semiconductor light emitting device may be greater than a second concentration of the yttrium aluminum garnet (YAG) diffuser particles more distant from the semiconductor light emitting device. The encapsulating material may include a first layer of encapsulating material with the phosphor particles and a second layer of encapsulating material with the yttrium aluminum garnet (YAG) diffuser particles. Moreover, the second layer of encapsulating material may be substantially free of the phosphor particles, and the first layer of encapsulating material may be substantially free of the yttrium aluminum garnet diffuser particles.

The yttrium aluminum garnet (YAG) diffuser particles may be substantially spherical yttrium aluminum garnet (YAG) diffuser particles. Moreover, each of the yttrium aluminum garnet (YAG) diffuser particles may have a width or diameter less than about 50 µm (micrometer). More particularly, each of the yttrium aluminum garnet (YAG) diffuser particles may have a width or diameter in the range of about 2 µm (micrometer) to about 25 µm (micrometer). The yttrium aluminum garnet (YAG) diffuser particles may have a refractive index of at least about 1.8, and more particularly the yttrium aluminum garnet (YAG) diffuser particles may have a refractive index of about 1.83. Moreover, the encapsulating material may include at least one of an epoxy, a resin, a silicone, a plastic, and/or other transparent or translucent material, and may have a refractive index of no more than about 1.6.

According to still other embodiments of the present invention, a lighting structure may include a semiconductor light emitting device configured to generate light responsive to an electrical signal applied thereto. In addition, an encapsulating material may be configured to transmit light generated by the semiconductor light emitting device, and the encapsulating material may include non-luminescent yttrium aluminum garnet (YAG) diffuser particles therein.

The non-luminescent yttrium aluminum garnet (YAG) diffuser particles may be substantially undoped non-luminescent yttrium aluminum garnet (YAG) diffuser particles. The non-luminescent yttrium aluminum garnet (YAG) diffuser particles may be distributed throughout the encapsulating material. A first concentration of the non-luminescent yttrium aluminum garnet (YAG) diffuser particles adjacent the semiconductor light emitting device may be greater than a second concentration of the non-luminescent yttrium aluminum garnet (YAG) diffuser particles more distant from the semiconductor light emitting device. The encapsulating material may include a first layer of encapsulating material with the non-luminescent yttrium aluminum garnet (YAG) diffuser particles and a second layer of encapsulating material that is substantially free of the non-luminescent yttrium aluminum garnet (YAG) diffuser particles.

The non-luminescent yttrium aluminum garnet (YAG) diffuser particles may include substantially spherical non-luminescent yttrium aluminum garnet (YAG) diffuser particles. Each of the non-luminescent yttrium aluminum garnet (YAG) diffuser particles may have a width or diameter less than about 50 μm (micrometer). More particularly, each of the yttrium aluminum garnet (YAG) diffuser particles may have a width or diameter in the range of about 2 μm (micrometer) to about 25 μm (micrometer). The non-luminescent yttrium aluminum garnet (YAG) diffuser particles may have a refractive index of at least about 1.8, and more particularly, the non-luminescent yttrium aluminum garnet (YAG) diffuser particles may have a refractive index of about 1.83.

The encapsulating material may include at least one of an epoxy, a resin, a silicone, a plastic, and/or other transparent or translucent material, and may have a refractive index of no more than about 1.6. The encapsulating material may further include phosphor particles therein, and the non-luminescent yttrium aluminum garnet (YAG) diffuser particles and the phosphor particles may have different compositions. The phosphor particles may include cerium doped yttrium aluminum garnet (YAG:Ce) phosphor particles.

DETAILED DESCRIPTION

Figure 1A:
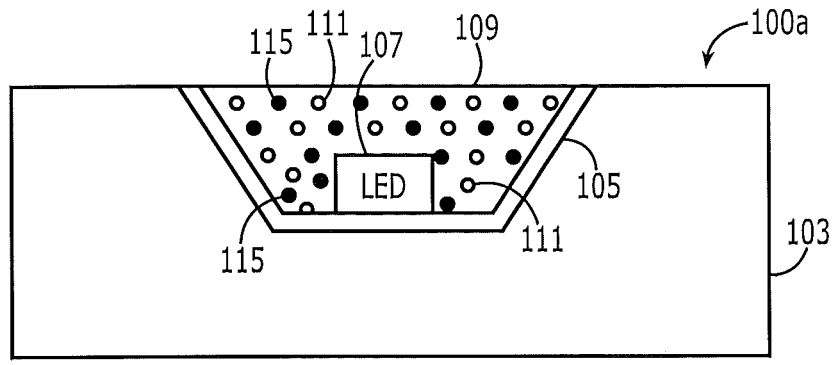
FIGS. 1A, 1B, and 1C are cross sectional views illustrating lighting devices including encapsulating materials with YAG diffusers dispensed on semiconductor light emitting devices after singulation according to some embodiments of the present invention.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As shown in FIG. 1A, lighting structure 101a may include a substrate 103 defining a cup or depression therein, a reflective layer 105 (e.g., a reflective metal layer) lining the cup or depression, a semiconductor light emitting device or LED 107 (e.g., a light emitting diode and/or laser diode), and an encapsulating material 109 on the LED 107. The semiconductor light emitting device 107, for example, may be configured to emit a particular wavelength of light responsive to an electrical signal applied thereto. More particularly, the light emitting device may include a group III nitride (e.g., gallium nitride, aluminum gallium nitride, etc.) light emitting structure configured to generate blue light. While not shown in FIG. 1A, LED 107 may be electrically coupled with conductive traces in/on/through substrate 103. If the LED 107 has a horizontal structure with both cathode and anode on a surface thereof opposite substrate 101, a pair of wirebonds may provide electrical coupling from the cathode and anode to substrate 103. If the LED 107 has a vertical structure with the cathode and anode on opposite (e.g., top and bottom) surfaces thereof, a single wirebond may provide electrical coupling from a top surface of LED 107 to substrate 103, while a bottom surface of LED 107 may be soldered or otherwise electrically coupled to substrate 103 without a wirebond.

As further shown in FIG. 1A, encapsulating material 109 may include non-luminescent phosphor host diffuser particles 111 (such as non-luminescent yttrium aluminum garnet (YAG) diffuser particles) and phosphor particles 115 therein with non-luminescent phosphor host diffuser particles 111 and phosphor particles 115 having different compositions. More particularly, non-luminescent phosphor host diffuser particles 111 may be substantially non-luminescent YAG (i.e., yttrium aluminum garnet or $Y_3Al_5O_{12}$) diffuser particles, and phosphor particles 115 may be luminescent cerium doped yttrium aluminum garnet (YAG:Ce) phosphor particles. For example, non-luminescent phosphor host diffuser particles 111 may be substantially undoped YAG diffuser particles. Stated in other words, a concentration of cerium in luminescent cerium doped yttrium aluminum garnet (YAG:Ce) phosphor particles 115 may be significantly greater than a concentration of cerium in YAG diffuser particles used as non-luminescent phosphor host diffuser particles 111.

As used herein, the term luminescent refers to the property of a material that emits one wavelength of electromagnetic radiation (e.g., one color of light) responsive to absorbing another (different) wavelength of electromagnetic radiation (e.g., a different color of light). For example, cerium doped YAG emits yellow light responsive to absorbing blue light. The term non-luminescent refers to the property of a material that does not emit significant electromagnetic radiation of a wavelength different than a wavelength of electromagnetic radiation absorbed by the non-luminescent material. For example, undoped YAG is substantially non-luminescent with respect to blue light. Moreover, the terms luminescent and non-luminescent may be taken with respect to a wavelength(s) of light emitted by a light emitting device(s) in a lighting structure including the luminescent or non-luminescent material. In a structure with a blue light emitting diode generating only blue light, for example, a material may be considered non-luminescent if the material is not luminescent with respect to the blue light of the light emitting diode even if the material may be luminescent with respect to another wavelength(s) not generated by the lighting structure.

Non-luminescent phosphor host diffuser particles 111 may be substantially spherical YAG diffuser particles having a width or diameter of less than about 50 µm (micrometer). More particularly, each of non-luminescent phosphor host diffuser particles 111 may be YAG diffuser particles having a width or diameter in the range of about 2 µm (micrometer) to about 25 µm (micrometer). Moreover, each of non-luminescent phosphor host diffuser particles 111 may have a refractive index of at least about 1.8 and more particularly about 1.83.

Encapsulating material 109 may be a material that may be dispensed in a liquid state and then cured/hardened. For example, encapsulating material 109 may be an epoxy, a resin, a silicone, a plastic, and/or other transparent or translucent material, and may have a refractive index of no more than about 1.6. Moreover, non-luminescent phosphor host diffuser particles 111 and phosphor particles 115 may be mixed with encapsulating material 109 while encapsulating material 109 is in the liquid state, and then dispensed with liquid encapsulating material 109 onto light emitting device 107. After dispensing on light emitting device 107, encapsulating material 109 may be cured and/or hardened with non-luminescent phosphor host diffuser particles 111 and phosphor particles 115 mixed therein.

As further shown in FIG. 1A, non-luminescent phosphor host diffuser particles 111 and/or phosphor particles 115 may be distributed throughout encapsulating material 109. According to other embodiments of the present invention, a first concentration of non-luminescent phosphor host diffuser particles 111 and/or phosphor particles 115 adjacent semiconductor light emitting device 107 may be greater than a second concentration of non-luminescent phosphor host diffuser particles 111 and/or phosphor particles 115 more distant from the semiconductor light emitting device 107. For example, non-luminescent phosphor host diffuser particles 111 and/or phosphor particles 115 may be allowed to settle (either intentionally or unintentionally) closer to light emitting device 107 before curing encapsulating material 109.

Substrate 103 is shown in FIG. 1A as a single element for ease of illustration, but other structures of substrate 103 may be provided. For example, substrate 103 may be a ceramic (e.g., alumina) substrate with the cup or depression formed therein. In an alternative, substrate 103 may include a ceramic (e.g, alumina), plastic, and/or metal base with a plastic cup thereon defining the cup or depression. A plastic base, for example, may include metal runners therein/thereon to provide electrical coupling for light emitting device 107. In addition, a glass lens may be provided on encapsulating material 109 to focus and/or spread light.

According to some embodiments of the present invention, LED 107 may generate substantially blue light that is transmitted through encapsulating material 109 (including non-luminescent phosphor host diffuser particles 111 and cerium doped YAG phosphor particles 115). Portions of the blue light that that interact with cerium doped YAG phosphor particles 115 may be converted to yellow light. Non-luminescent phosphor host diffuser particles 111 (such as YAG diffuser particles) may further diffuse the blue and yellow light to provide white light having better color uniformity. Because non-luminescent phosphor host diffuser particles 111 may be provided as substantially spherical diffuser particles with a relatively high refractive index relative to the surrounding encapsulating material 109, light diffusion may be improved with reduced backscatter toward LED 107. For example, relatively high quality non-luminescent phosphor host diffuser particles 111 may be provided using YAG diffuser particles with low impurity concentrations to reduce loss relative to conventional diffuser materials (e.g., $TiO_2$) which may be more expensive and higher loss materials.

Figure 1B:
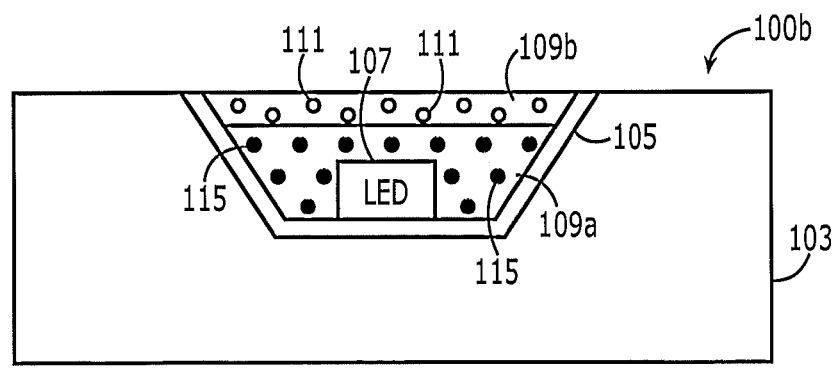

Lighting structure 100b of FIG. 1B is the same as lighting structure 100a with the exception that phosphor particles 115 and non-luminescent phosphor host diffuser particles 111 are provided in separate layers of encapsulating material 109a and 109b. Further discussion of elements of FIG. 1B that have already been discussed with respect to FIG. 1A will omitted for the sake of conciseness. Instead, discussion relating to FIG. 1B will focus on elements thereof that are different than FIG. 1B.

As shown in FIG. 1B, layer of encapsulating material 109a may include phosphor particles 115, and layer of encapsulating material 109b may include non-luminescent phosphor host diffuser particles 111. Moreover, layer of encapsulating material 109a may be substantially free of non-luminescent phosphor host diffuser particles 111, and layer of encapsulating material 109b may be substantially free of phosphor particles 115. Accordingly, liquid encapsulating material with phosphor particles 115 mixed therein may be dispensed on LED 107 and then at least partially cured/hardened to provide layer of encapsulating material 109a. Then, liquid encapsulating material with non-luminescent phosphor host diffuser particles 111 mixed therein may be dispensed on layer 109a and then cured/hardened to provide layer of encapsulating material 109b.

Figure 1C:
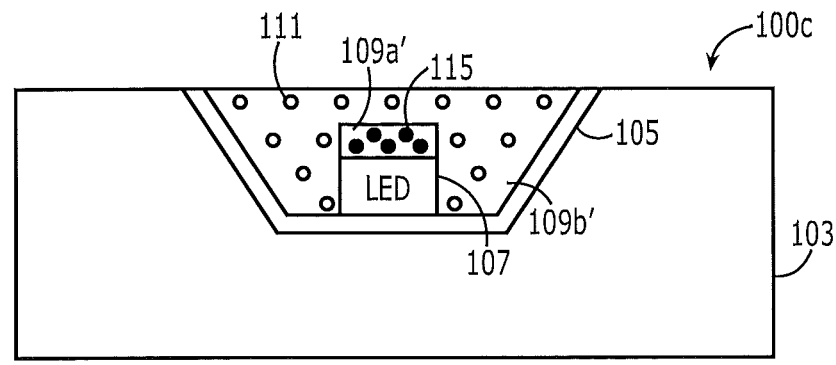

Lighting structure 100c of FIG. 1C is the same as lighting structure 100b with the exception that phosphor particles 115 are provided in layer of encapsulating material 109a' that is provided only on a surface of LED 107. Further discussion of elements of FIG. 1C that have already been discussed with respect to FIGS. 1A and 1B will omitted for the sake of conciseness. Instead, discussion relating to FIG. 1C will focus on elements thereof that are different than FIGS. 1A and 1B.

As shown in FIG. 1C, layer of encapsulating material 109a' may include phosphor particles 115, and layer of encapsulating material 109b' may include non-luminescent phosphor host diffuser particles 111. Moreover, layer of encapsulating material 109a' may be substantially free of non-luminescent phosphor host diffuser particles 111, and layer of encapsulating material 109b' may be substantially free of phosphor particles 115. More particularly, liquid encapsulating material with phosphor particles 115 mixed therein may be dispensed on a wafer including a plurality of LEDs 107 and then cured/hardened. The wafer may then be singulated (e.g., by dicing or sawing) to provide individual LED 107 with encapsulating material 109a' thereon. Because LED 107 may be singulated with encapsulating material 109a' thereon, sidewalls of LED 107 and encapsulating material 109a' may be aligned. LED 107 (with encapsulating material 109a' thereon) may then be bonded to substrate 103, and then, liquid encapsulating material with non-luminescent phosphor host diffuser particles 111 mixed therein may be dispensed and cured/hardened to provide layer of encapsulating material 109b'.

Figure 2A:
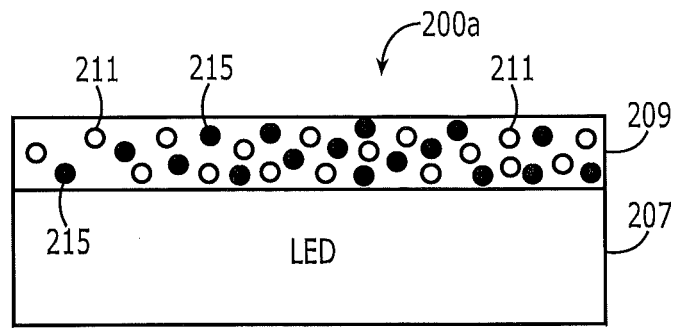
FIGS. 2A and 2B are cross sectional views illustrating lighting devices including encapsulating materials with YAG diffusers dispensed on light emitting devices before singulation according to some embodiments of the present invention.
Figure 2B:
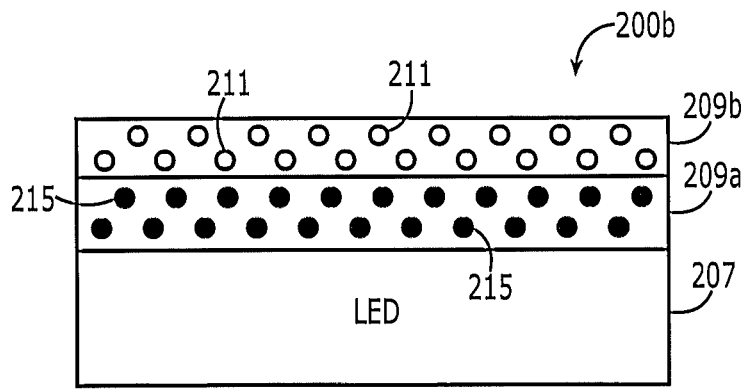

FIGS. 2A and 2B illustrate lighting structures 200a and 200b with non-luminescent phosphor host diffuser particles 211 (such as non-luminescent YAG diffuser particles) and phosphor particles 215 distributed in one or more layers of encapsulating material on a semiconductor light emitting device (LED) 207 (e.g., light emitting diode and/or laser diode). As shown in FIG. 2A, encapsulating material 209 may include non-luminescent phosphor host diffuser particles 211 and phosphor particles 215 therein with non-luminescent phosphor host diffuser particles 211 and phosphor particles 215 having different compositions. More particularly, non-luminescent phosphor host diffuser particles 211 may be substantially non-luminescent YAG diffuser particles, and phosphor particles 215 may be luminescent cerium doped yttrium aluminum garnet (YAG:Ce) phosphor particles. For example, non-luminescent phosphor host diffuser particles 211 may be substantially undoped YAG diffuser particles. Stated in other words, a concentration of cerium in luminescent cerium doped yttrium aluminum garnet (YAG:Ce) phosphor particles 215 may be significantly greater than a concentration of cerium in YAG diffuser particles used as non-luminescent phosphor host diffuser particles 211.

Non-luminescent phosphor host diffuser particles 211 may be substantially spherical YAG diffuser particles having a width or diameter of less than about 50 μm (micrometer). More particularly, each of non-luminescent phosphor host diffuser particles 211 may have a width or diameter in the range of about 2 μm (micrometer) to about 25 μm (micrometer). Moreover, each of non-luminescent phosphor host diffuser particles 211 may have a refractive index of at least about 1.8 and more particularly about 1.83.

Encapsulating material 209 may be a material that may be dispensed in a liquid state and then cured/hardened. For example, encapsulating material 209 may be an epoxy, a resin, a silicone, a plastic, and/or other transparent or translucent material, and may have a refractive index of no more than about 1.6. Moreover, non-luminescent phosphor host diffuser particles 211 and phosphor particles 215 may be mixed with encapsulating material 209 while encapsulating material 209 is in the liquid state, and then dispensed with liquid encapsulating material 209 onto light emitting device 207. After dispensing on light emitting device 207, encapsulating material 209 may be cured and/or hardened with non-luminescent phosphor host diffuser particles 211 and phosphor particles 215 mixed therein. In embodiments of FIG. 2A, encapsulating material 209 may be dispensed (e.g., using a spin dispensing operation) on a semiconductor wafer including a plurality of LEDs 207 and cured/hardened before separating the plurality of LEDs 207 (e.g., by dicing or sawing). Accordingly, sidewalls of LED 207 and encapsulating material 209 may be aligned as shown in FIG. 2A.

As further shown in FIG. 2A, non-luminescent phosphor host diffuser particles 211 and/or phosphor particles 215 may be distributed throughout encapsulating material 209. According to other embodiments of the present invention, a first concentration of non-luminescent phosphor host diffuser particles 211 and/or phosphor particles 215 adjacent semiconductor light emitting device 207 may be greater than a second concentration of non-luminescent phosphor host diffuser particles 211 and/or phosphor particles 215 more distant from the semiconductor light emitting device 207. For example, non-luminescent phosphor host diffuser particles 211 and/or phosphor particles 215 may be allowed to settle (either intentionally or unintentionally) closer to light emitting device 207 before curing encapsulating material 209.

According to some embodiments of the present invention, LED 207 may generate substantially blue light that is transmitted through encapsulating material 209 (including non-luminescent phosphor host diffuser particles 211 and cerium doped YAG phosphor particles 215). Portions of the blue light that that interact with cerium doped YAG phosphor particles 215 may be converted to yellow light. Non-luminescent phosphor host diffuser particles 211 may further diffuse the blue and yellow light to provide white light having better color uniformity. Because non-luminescent phosphor host diffuser particles 211 may be provided as substantially spherical diffuser particles with a relatively high refractive index relative to the surrounding encapsulating material 209, light diffusion may be improved with reduced backscatter toward LED 207. Moreover, relatively high quality non-luminescent phosphor host diffuser particles 211 may be provided using YAG diffuser particles with low impurity concentrations to reduce loss relative to conventional diffuser materials (e.g., $TiO_2$) which may be more expensive and higher loss materials.

Lighting structure 200b of FIG. 2B is the same as lighting structure 200a with the exception that phosphor particles 215 and non-luminescent phosphor host diffuser particles 211 are provided in separate layers of encapsulating material 209a and 209b. Further discussion of elements of FIG. 2B that have already been discussed with respect to FIG. 2A will omitted for the sake of conciseness. Instead, discussion relating to FIG. 2B will focus on elements thereof that are different than FIG. 2B.

As shown in FIG. 2B, layer of encapsulating material 209a may include phosphor particles 215, and layer of encapsulating material 209b may include non-luminescent phosphor host diffuser particles 211. Moreover, layer of encapsulating material 209a may be substantially free of non-luminescent phosphor host diffuser particles 211, and layer of encapsulating material 209b may be substantially free of phosphor particles 215. Accordingly, liquid encapsulating material with phosphor particles 215 mixed therein may be dispensed on LED 207 and then cured/hardened to provide layer of encapsulating material 209a. Then, liquid encapsulating material with non-luminescent phosphor host diffuser particles 211 mixed therein may be dispensed on layer 209a and then cured/hardened to provide layer of encapsulating material 209b. As discussed above with respect to encapsulating material 209 of FIG. 2A, layers 209a and 209b of encapsulating material may be dispensed and cured/hardened on a wafer including a plurality of LEDs 207 before LED separation.

Figure 3:
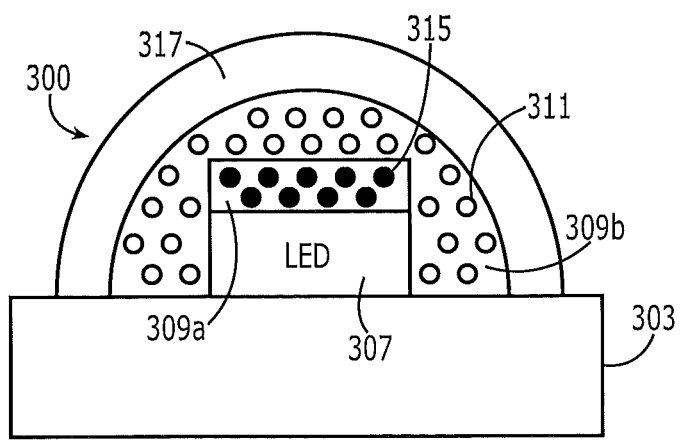
FIG. 3 is a cross sectional view illustrating light emitting devices including glob top encapsulating materials with YAG diffusers according to some embodiments of the present invention.

FIG. 3 illustrates lighting structure 300 with non-luminescent phosphor host diffuser particles 311 (such as YAG diffuser particles) distributed in glob top encapsulating material 309b that is dispensed after bonding light emitting device 307 (e.g., light emitting diode and/or laser diode) to substrate 303. Before dispensing glob top encapsulating layer 309b, layer of encapsulating material 309a including phosphor particles 315 may be dispensed or otherwise provided or coated on a wafer including a plurality of light emitting devices (LEDs) 307 and cured/hardened before LED separation. The LEDs 307 of the wafer may then be separated (e.g., by sawing or dicing) to provide individual LED 307 with layer of encapsulating material 315 on a surface thereof. LED 307 (with layer of encapsulating material 315 thereon) may then be bonded to substrate 307. Glob top encapsulating material 309b (with non-luminescent phosphor host diffuser particles 311 dispersed therein) may then be dispensed on LED 307 (including encapsulating material 309a thereon) and on substrate 303 in a liquid form and then cured/hardened. Accordingly, encapsulating material 309a may be substantially free of non-luminescent phosphor host diffuser particles 311, and encapsulating material 309b may be substantially free of phosphor particles 315. An additional glob top layer of encapsulating material 317 may be dispensed in a liquid state and then cured/hardened, and glob top layer of encapsulating material 317 may be substantially free of both YAG diffuser particles and phosphor particles. Encapsulating material 317, for example, may provide additional beam focusing, beam shaping, and/or beam dispersion.

As discussed above with respect to FIGS. 1A-B and 2A-B, non-luminescent phosphor host diffuser particles 311 and phosphor particles 315 may have different compositions. More particularly, non-luminescent phosphor host diffuser particles 311 may be substantially non-luminescent YAG diffuser particles, and phosphor particles 315 may be luminescent cerium doped yttrium aluminum garnet (YAG:Ce) phosphor particles. For example, non-luminescent phosphor host diffuser particles 311 may be substantially undoped YAG diffuser particles. Stated in other words, a concentration of cerium in luminescent cerium doped yttrium aluminum garnet (YAG:Ce) phosphor particles 315 may be significantly greater than a concentration of cerium in YAG diffuser particles used as non-luminescent phosphor host diffuser particles 311. Moreover, yttrium aluminum garnet non-luminescent phosphor host diffuser particles 311 may be substantially spherical YAC diffuser particles having a width or diameter of less than about 50 μm (micrometer). More particularly, each of non-luminescent phosphor host diffuser particles 311 may have a width or diameter in the range of about 2 μm (micrometer) to about 25 μm (micrometer). Moreover, each of non-luminescent phosphor host diffuser particles 311 may have a refractive index of at least about 1.8 and more particularly about 1.83.

In addition, each of encapsulating materials 309a and 309b may be an epoxy, a resin, a silicone, a plastic, and/or other transparent or translucent material, and may have a refractive index of no more than about 1.6. Moreover, phosphor particles 315 and non-luminescent phosphor host diffuser particles 311 may be mixed with respective encapsulating materials 309a and 309b while in the liquid state, and then dispensed with liquid encapsulating material 309a or 309b. After dispensing, encapsulating material 309a or 309b may be cured and/or hardened with phosphor particles 315 or non-luminescent phosphor host diffuser particles 311 mixed therein. In embodiments of FIG. 3, encapsulating material 309a may be dispensed (e.g., using a spin dispensing operation) on a semiconductor wafer including a plurality of LEDs 307 and cured/hardened before separating the plurality of LEDs 307 (e.g., by dicing or sawing). Accordingly, sidewalls of LED 307 and encapsulating material 309a may be aligned as shown in FIG. 3.

According to some embodiments of the present invention, LED 307 may generate substantially blue light that is transmitted through encapsulating material 309a (including cerium doped YAG phosphor particles 315) and through encapsulating material 309b (including non-luminescent phosphor host diffuser particles 315 such as undoped YAG diffuser particles). Portions of the blue light that interact with cerium doped YAG phosphor particles 315 may be converted to yellow light. Non-luminescent phosphor host diffuser particles 311 may further diffuse the blue and yellow light to provide white light having better color uniformity. Because non-luminescent phosphor host diffuser particles 311 may be provided as substantially spherical diffuser particles with a relatively high refractive index relative to the surrounding encapsulating material 309, light diffusion may be improved with reduced backscatter toward LED 307. Moreover, relatively high quality non-luminescent phosphor host diffuser particles 311 may be produced with low impurity concentrations to reduce loss relative to conventional diffuser materials (e.g., $TiO_2$) which may be more expensive and higher loss materials.

According to additional embodiments of the present invention, encapsulating material 309a may be omitted, and both phosphor particles 315 and non-luminescent phosphor host diffuser particles 311 may be dispersed in glob top encapsulating material 309b. According to still other embodiments of the present invention, a first glob top encapsulating material including phosphor particles 315 may be provided on LED 307 and substrate 303, and then a second glob top encapsulating material including non-luminescent phosphor host diffuser particles 311 may be provided on the first glob top encapsulating material.

As discussed above, LEDs 107, 207, and 307 may be group III nitride (e.g., gallium nitride, aluminum gallium nitride, etc.) light emitting devices configured to generate blue light responsive to an electrical signal applied thereto. Moreover, phosphor particles 115, 215, and 315 may be cerium doped YAG phosphor particles configured to convert a portion of blue light generated by LEDs 107, 207, and 307 into yellow light. The resulting blue and yellow light may then mix to provide a substantially white light output from respective lighting structures 100a, 100b, 100c, 200a, 200b, and 300. By providing non-luminescent phosphor host diffuser particles 111, 211, and/or 311, as discussed above, improved color uniformity may be provided. While blue light emitting devices and yellow phosphors are discussed by way of example, lighting structures including other phosphors and/or other light emitting devices may be provided according to embodiments of the present invention. By way of example, ultraviolet light emitting devices may be used with red, green, and/or blue phosphors.

Figure 4:
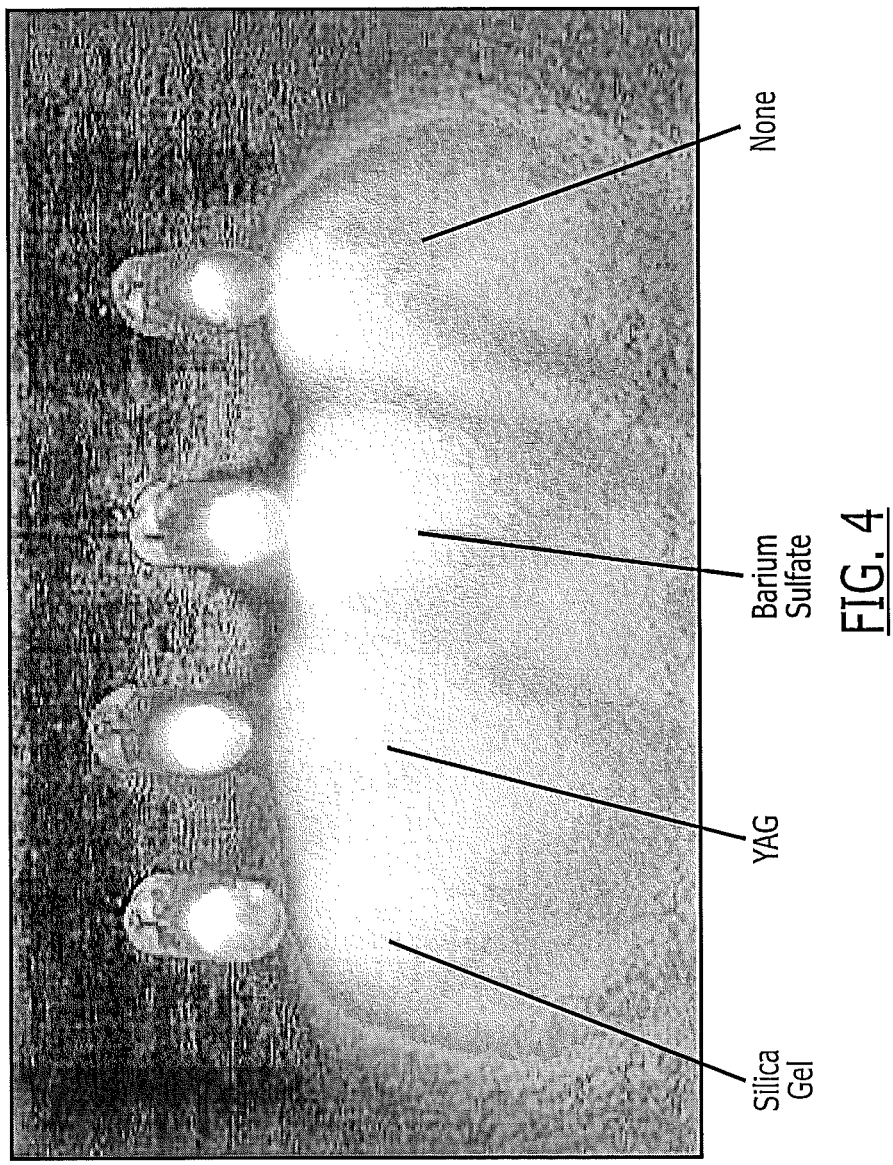
FIG. 4 is a photograph illustrating performance of a light emitting diode including YAG diffuser particles according to embodiments of the present invention.

FIG. 4 is a photograph illustrating light output from four different lighting structures. For sake of comparison, one of the lighting structures (second from the left) uses undoped YAG diffuser particles according to embodiments of the present invention, while two of the lighting structures use other diffuser particles (i.e., silica gel and barium sulfate), and the remaining lighting structure uses no diffuser particles. Each of the lighting structures of FIG. 4 uses a blue light emitting diode and cerium doped YAG yellow phosphor particles to provide substantially white light. As shown in FIG. 4, the lighting structure with undoped YAG diffuser particles may provide improved color uniformity. With increasing use of larger phosphor particles that provide less scattering of blue light, YAG diffuser particles (with substantially spherical shape and a relatively high index of refraction of about 1.83) according to embodiments of the present invention may provide broader diffusion with less backscatter towards the LED. As compared with conventional diffuser particles such as $TiO_2$, undoped YAG diffuser particles may be relatively inexpensive with relatively few impurities and lower loss. High quality, low loss undoped YAG diffuser particles may be produced, for example, using techniques used to produce cerium doped YAG phosphor particles by omitting the cerium.

Lighting structures of FIGS. 1A-1C, 2A-2B, and 3 according to embodiments of the present invention are discussed above by way of example without limiting the scope of the present invention. Undoped YAG diffuser particles according to embodiments of the present invention, for example, may be used with phosphor materials other than cerium doped YAG phosphor materials, with light emitting devices (e.g., light emitting diodes and/or laser diodes) providing a light color(s) other than blue, with phosphor materials providing color conversions other than blue to yellow, and/or with lighting structures omitting phosphor materials. YAG diffuser particles, for example, may be provided with any of the lighting structures of U.S. Patent Publication No. 2007/0262339 published Nov. 15, 2007, entitled "Side-View Surface Mount White LED; U.S. Publication No. 2008/0054279 published Mar. 6, 2008, entitled "Phosphor Position In Light Emitting Diodes"; U.S. Publication No. 2008/0054284 published Mar. 6, 2008, entitled "Encapsulant Profile For Light Emitting Diodes"; U.S. Publication No. 2008/0173883 published Jul. 24, 2008, entitled "High Performance LED Package"; and/or U.S. application Ser. No. 12/273,216, filed Nov. 18, 2008, entitled "Semiconductor Light Emitting Apparatus Including Elongated Hollow Wavelength Conversion Tubes And Methods Of Assembling Same". The disclosures of each of the above reference patent publications/applications are hereby incorporated herein in their entirety by reference. By way of example, undoped non-luminescent YAG diffuser particles may be included in an encapsulating material defined by an elongated wavelength conversion tube as discussed in U.S. application Ser. No. 12/273,216, the disclosure of which is incorporated above. Accordingly, an air gap or vacuum may be provided between the semiconductor light emitting device and the undoped non-luminescent YAG diffuser particles dispersed in such a wavelength conversion tube.

Moreover, light emitting devices 107, 207, and/or 307 may be represented by a commercially available LED, such as a Cree® EZ1000™ LED, manufactured by the assignee of the present invention, and described in the Data Sheet CPR3CR, Rev. A, entitled "Cree® EZ1000™ LEDs Data Sheet CxxxEZ1000-Sxx000", copyright 2006, Cree, Inc., available on the Web at cree.com. As indicated in this data sheet, these LEDs may use a single semiconductor die of size 980/980 $\mu m^2$ or about 1 $mm^2$. These LEDs may operate at a voltage of about 3 V (more typically about 3.3 V), and a current of about 350 mA (current density of about 35 $A/cm^2$) for an input power of about 1 watt. The Cree EZ1000 LED may be manufactured under one or more of the following U.S. patents/applications, the disclosures of which are hereby incorporated herein in their entirety as if set forth fully herein: U.S. Pat. No. D566,057, issued Apr. 8, 2008, entitled "LED Chip"; U.S. Application Publication No. 2008/0173884, published Jul. 24, 2008, entitled "Wafer Level Phosphor Coating Method and Devices Fabricated Utilizing Same"; U.S. Application Publication No. 2008/0179611, published Jul. 31, 2008, entitled "Wafer Level Phosphor Coating Method and Devices Fabricated Utilizing Same"; and/or U.S. application Ser. No. 29/284,431, filed Sep. 7, 2007, entitled "LED Chip". The disclosures of each of the above referenced documents is hereby incorporated herein in its entirety by reference. However, other commercially available packaged LEDs or bare LED die may be used.

As used herein, the term phosphor host may refer to any material that may be used as a host for a luminescent dopant (also referred to as an activator) to provide a phosphor. More particularly, phosphor host materials may include an inorganic, highly crystalline solid material such as yttrium aluminum garnet. When undoped, such a phosphor host material may be non-luminescent, and the non-luminescent phosphor host material may be used to provide diffuser particles according to embodiments of the present invention. When doped with a luminescent dopant (or activator) such as cerium, europium, manganese, and/or terbium, such a phosphor host material may be luminescent, and the luminescent phosphor host material may be used to provide phosphor particles according to embodiments of the present invention.

As discussed above by way of example with respect to FIGS. 1A-C, 2A-B, 3, and 4, luminescent phosphor particles such as cerium doped yttrium aluminum garnet (YAG:Ce) phosphor particles may be used together with non-luminescent phosphor host diffuser particles such as non-luminescent undoped yttrium aluminum garnet (YAG) phosphor host particles according to some embodiments of the present invention. Embodiments of the present invention discussed above with respect to FIGS. 1A-C, 2A-B, 3, and 4 may also be implemented with luminescent phosphor particles using other phosphor host materials, with luminescent phosphor particles using other luminescent doping elements, and/or with non-luminescent phosphor host diffuser particles using other non-luminescent phosphor host materials. Non-luminescent phosphor host diffuser particles (e.g., non-luminescent phosphor host diffuser particles 111, 211, and/or 311) according to embodiments of the present invention may be provided using one or more of the undoped phosphor host materials identified in Table 1.

TABLE 1

$(Ba,Sr,Ca)_5(PO_4)_3(Cl,F,Br,OH)$;
$(Ba,Sr,Ca)BPO_5$;
$(Sr,Ca)_{10}(PO_4)_6*\upsilon B_2O_3$ (wherein $0 \le \upsilon \le 1$);
$Sr_2Si_3O_8*2SrCl_2$;
$(Ca,Sr,Ba)_3MgSi_2O_8$;
$BaAl_8O_{13}$;
$2SrO*0.84P_2O_5*0.16B_2O_3$;
$(Ba,Sr,Ca)MgAl_{10}O_{17}$;
$(Ba,Sr,Ca)Al_2O_4$;
$(Y,Gd,Lu,Sc,La)BO_3$;
$(Ba,Sr,Ca)_2Si_{1-\xi}O_{4-2\xi}$ (wherein $0 \le \xi \le 0.2$);
$(Ba,Sr,Ca)_2(Mg,Zn)Si_2O_7$;
$(Sr,Ca,Ba)(Al,Ga,In)_2S_4$;
$(Y,Gd,Tb,La,Sm,Pr,Lu)_3(Al,Ga)_{5-\lambda}O_{12-3/2\lambda}$ (wherein $0 \le \lambda \le 0.5$);
$(Lu,Y,Sc)_{2-\rho}(Ca,Mg)_{1+\rho}Li_\sigma Mg_{2-\sigma}(Si—,Ge)_{3-\sigma}P_\sigma O_{12-\rho}$ (wherein $0 \le \rho \le 0.5, 0 \le \sigma \le 0.5$);
$(Ca,Sr)_8(Mg,Zn)(SiO_4)_4Cl_2$;
$Na_2Gd_2B_2O_7$;
$(Sr,Ca,Ba,Mg,Zn)_2P_2O_7$;
$(Gd,Y,Lu,La)_2O_3$;
$(Gd,Y,Lu,La)_2O_2S$;
$(Gd,Y,Lu,La)VO_4$;
$(Ca,Sr)S$;
$SrY_2S_4$;
$CaLa_2S_4$;
$(Ba,Sr,Ca)MgP_2O_7$;
$(Y,Lu)_2WO_6$;
$(Ba,Sr,Ca)_\beta Si_\gamma N_\mu$ (wherein $2\beta + 4\gamma = 3\mu$);
$Ca_3(SiO_4)Cl_2$;
$(Y,Lu,Gd)_{2-\phi}Ca_\phi Si_4N_{6+\phi}C_{1-\phi}$ (wherein $0 \le \phi \le 0.5$);
$(Lu,Ca,Li,Mg,Y)\alpha$-SiAlON;
$3.5MgO*0.5MgF_2*GeO_2$;
$(Ca, Sr)AlSiN_3$;
$SiAlO_xN_y$; and/or
$(Ba, Sr)SiO_4$.

One or more of the above reference phosphor host materials may be doped with an activator (e.g., Ce, Eu, Mn, and/or Tb) to provide luminescent phosphor particles (e.g., phosphor particles 115, 215, and/or 315) as identified in Table 2.

TABLE 2

$(Ba,Sr,Ca)_5(PO_4)_3(Cl,F,Br,OH)$: $Eu^{2+},Mn^{2+}$;
$(Ba,Sr,Ca)BPO_5$: $Eu^{2+},Mn^{2+}$;
$(Sr,Ca)_{10}(PO_4)_6*\upsilon B_2O_3$: $Eu^{2+}$ (wherein $0 < \upsilon \le 1$);
$Sr_2Si_3O_8*2SrCl_2$: $Eu^{2+}$;
$(Ca,Sr,Ba)_3MgSi_2O_8$: $Eu^{2+},Mn^{2+}$;
$BaAl_8O_{13}$: $Eu^{2+}$;
$2SrO*0.84P_2O_5*0.16B_2O_3$: $Eu^{2+}$;
$(Ba,Sr,Ca)MgAl_{10}O_{17}$: $Eu^{2+},Mn^{2+}$;
$(Ba,Sr,Ca)Al_2O_4$: $Eu^{2+}$;
$(Y,Gd,Lu,Sc,La)BO_3$: $Ce^{3+},Tb^{3+}$;
$(Ba,Sr,Ca)_2Si_{1-\xi}O_{4-2\xi}$: $Eu^{2+}$ (wherein $0 \le \xi \le 0.2$);
$(Ba,Sr,Ca)_2(Mg,Zn)Si_2O_7$: $Eu^{2+}$;
$(Sr,Ca,Ba)(Al,Ga,In)_2S_4$: $Eu^{2+}$;
$(Y,Gd,Tb,La,Sm,Pr,Lu)_3(Al,Ga)_{5-\lambda}O_{12-3/2\lambda}$: $Ce^{3+}$ (wherein $0 \le \lambda \le 0.5$);
$(Lu,Y,SC)_{2-\rho}(Ca,Mg)_{1+\rho}Li_\sigma Mg_{2-\sigma}(Si—,Ge)_{3-\sigma}P_\sigma O_{12-\rho}$: $Ce^{3+}$ (wherein $0 \le \rho \le 0.5, 0 \le \sigma \le 0.5$);
$(Ca,Sr)_8(Mg,Zn)(SiO_4)_4Cl_2$: $Eu^{2+}, Mn^{2+}$;
$Na_2Gd_2B_2O_7$: $Ce^{3+},Tb^{3+}$;
$(Sr,Ca,Ba,Mg,Zn)_2P_2O_7$: $Eu^{2+},Mn^{2+}$;
$(Gd,Y,Lu,La)_2O_3$: $Eu^{3+},Bi^{3+}$;
$(Gd,Y,Lu,La)_2O_2S$: $Eu^{3+},Bi^{3+}$;
$(Gd,Y,Lu,La)VO_4$: $Eu^{3+},Bi^{3+}$;
$(Ca,Sr)S$: $Eu^{2+}$;
$(Ca,Sr)S$: $Eu^{2+},Ce^{3+}$;
$SrY_2S_4$: $Eu^{2+}$;

TABLE 2-continued $CaLa_2S_4$: $Ce^{3+}$;
$(Ba,Sr,Ca)MgP_2O_7$: $Eu^{2+},Mn^{2+}$;
$(Y,Lu)_2WO_6$: $Eu^{3+},Mo^{6+}$;
$(Ba,Sr,Ca)_\beta Si_\gamma N_\mu$: $Eu^{2+}$ (wherein $2\beta + 4\gamma = 3\mu$);
$Ca_3(SiO_4)Cl_2$: $Eu^{2+}$;
$(Y,Lu,Gd)_{2-\phi}Ca_\phi Si_4N_{6+\phi}C_{1-\phi}$: $Ce^{3+}$ (wherein $0 \le \phi \le 0.5$);
$(Lu,Ca,Li,Mg,Y)\alpha$-SiAlON doped with $Eu^{2+}$ and/or $Ce^{3+}$;
$3.5MgO*0.5MgF_2*GeO_2$: $Mn^{4+}$:
$(Ca, Sr)AlSiN_3$: $Eu^{2+}$;
$SiAlO_xN_y$: $Eu^{2+}$; and/or
$(Ba, Sr)SiO_4$: $Eu^{2+}$.

Moreover, a same phosphor host material may be used to provide non-luminescent phosphor host diffuser particles (e.g., non-luminescent phosphor host diffuser particles 111, 211, and/or 311) and luminescent phosphor particles (e.g., phosphor particles 115, 215, and/or 315) according to some embodiments of the present invention to provide compatibility within an environment in which the diffuser and phosphor particles are used. In other words, if same phosphor host material (doped for phosphor particles and undoped for diffuser particles) is used for both phosphor and diffuser particles in a system, both phosphor and diffuser particles may demonstrate the same or similar physical/chemical/environmental compatibilities so that both phosphor and diffuser particles may be compatible with the same encapsulating material(s) over the same operating temperature ranges. Accordingly, performance of a lighting structure may be improved according to embodiments of the present invention by providing diffuser and phosphor particles using a same phosphor host material.

According to some embodiments of the present invention, non-luminescent diffuser particles (e.g., diffuser particles 111, 211, and/or 311) may be provided using a phosphor host material as identified above in Table 1. More particularly, non-luminescent diffuser particles may be provided using one or more phosphor host materials that are used in phosphors for light emitting diode applications to convert a relatively low wavelength of visible light (e.g., blue light having a wavelength in the range of about 430 nm to about 500 nm) to a relatively high wavelength of visible light (e.g., yellow light having a wavelength in the range of about 560 nm to about 590 nm). For example, non-luminescent diffuser particles may be provided using a phosphor host material such as a nitride phosphor host material (e.g., $CaSiN_2$, $Ba_2Si_5N_8$, $CaSiAlN_3$, etc. or more generally $(Ba,Sr,Ca)_\beta Si_\gamma N_\mu$ where $2\beta+4\gamma=3\mu$); an oxynitride phosphor host material (e.g., $SiAlO_xN_y$ or $(Lu,Ca,Li,Mg,Y)\alpha$-SiAlON); a sulfide phosphor host material (e.g., $(Ca,Sr)S$); a silicate phosphor host material (e.g., barium orthosilicate or BOSE, $(Ba,Sr,Ca)_2Si_{1-\xi}O_{4-2\xi}$ where $0\le\xi\le0.2$; or $(Ba,Sr,Ca)_2(Mg,Zn)Si_2O_7$); or garnet phosphor host materials (e.g., yttrium aluminum garnet or YAG, terbium aluminum garnet or TAG, or $(Y,Gd,Tb,La,Sm,Pr,Lu)_3(Al,Ga)_{5-\lambda}O_{12-3/2\lambda}$ where $0\le\lambda\le0.5$). These phosphor host materials may thus be used to provide non-luminescent diffuser particles that are compatible for use with blue light emitting diodes and band emission phosphor particles that convert a portion of the blue light to a higher wavelength of visible light (e.g., yellow) to provide substantially white light.

The phosphor host materials discussed above with respect to Table 1 (and more particularly, nitride phosphor host materials, oxynitride phosphor host materials, sulfide phosphor host materials, silicate phosphor host materials, or garnet phosphor host materials) may be used to provide high transparency (low loss) and high refractive index (e.g., at least about 1.8) non-luminescent diffuser particles. The resulting non-luminescent diffuser particles may be inorganic crystalline spheres with widths/diameters of less than about 50 micrometers, and more particularly, in a range of about 2 micrometers to about 25 micrometers. Moreover, these non-luminescent diffuser particles may be produced using grinding and sintering with a flux as will be understood by one of skill in the art. By providing high transparency and high refractive index (relative to the encapsulating material), diffusion properties may be improved.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A lighting structure comprising:
   a semiconductor light emitting device configured to generate light responsive to an electrical signal applied thereto; and
   an encapsulating material configured to transmit light generated by the semiconductor light emitting device wherein the encapsulating material includes luminescent phosphor particles and non-luminescent diffuser particles therein, wherein the phosphor particles comprise a phosphor host material doped with a luminescent activator, wherein the non-luminescent diffuser particles comprise the phosphor host material, wherein a first concentration of the non-luminescent diffuser particles in a first portion of the encapsulating material adjacent the semiconductor light emitting device is different than a second concentration of the non-luminescent diffuser particles in a second portion of the encapsulating material more distant from the semiconductor light emitting device, and wherein the first and second concentrations are greater than zero;
   wherein the first portion of the encapsulating material includes a first layer of encapsulating material including the luminescent phosphor particles, and wherein the second portion of the encapsulating material includes a second layer of encapsulating material including the non-luminescent diffuser particles, wherein the second layer of encapsulating material is substantially free of the luminescent phosphor particles.

2. A lighting structure according to claim 1 wherein the phosphor particles comprise cerium doped yttrium aluminum garnet, YAG:Ce, phosphor particles.

3. A lighting structure according to claim 1 wherein the non-luminescent diffuser particles comprise non-luminescent yttrium aluminum garnet, YAG, diffuser particles.

4. A lighting structure according to claim 1 wherein the phosphor host material comprises at least one of $(Ba,Sr,Ca)_5(PO_4)_3(Cl,F,Br,OH)$; $(Ba,Sr,Ca)BPO_5$; $(Sr,Ca)_{10}(PO_4)_6*\upsilon B_2O_3$ wherein $0\le\upsilon\le1$; $Sr_2Si_3O_8*2SrCl_2$; $(Ca,Sr,Ba)_3MgSi_2O_8$; $BaAl_8O_{13}$; $2SrO*0.84P_2O_5*0.16B_2O_3$; $(Ba,Sr,Ca)MgAl_{10}O_{17}$; $(Ba,Sr,Ca)Al_2O_4$; $(Y,Gd,Lu,Sc,La)BO_3$; $(Ba,Sr,Ca)_2Si_{1-\xi}O_{4-2\xi}$ wherein $0\le\xi\le0.2$; $(Ba,Sr,Ca)_2(Mg,Zn)Si_2O_7$; $(Sr,Ca,Ba)(Al,Ga,In)_2S_4$; $(Y,Gd,Tb,La,Sm,Pr,Lu)_3(Al,Ga)_{5-\lambda}O_{12-3/2\lambda}$ wherein $0\le\lambda\le0.5$; $(Lu,Y,Sc)_{2-\rho}(Ca,Mg)_{1+\rho}Li_\sigma Mg_{2-\sigma}(Si—,Ge)_{3-\sigma}P_\sigma O_{12-\rho}$ (wherein $0\le\rho\le0.5$, $0\le\sigma\le0.5$); $(Ca,Sr)_8(Mg,Zn)(SiO_4)_4Cl_2$; $Na_2Gd_2B_2O_7$; $(Sr,Ca,Ba,Mg,Zn)_2P_2O_7$; $(Gd,Y,Lu,La)_2O_3$; $(Gd,Y,Lu,La)_2O_2S$; $(Gd,Y,Lu,La)VO_4$; $(Ca,Sr)S$; $SrY_2S_4$; $CaLa_2S_4$; $(Ba,Sr,Ca)MgP_2O_7$; $(Y,Lu)_2WO_6$; $(Ba,Sr,Ca)_\beta Si_\gamma N_\mu$ wherein $2\beta+4\gamma=3\mu$; $Ca_3(SiO_4)Cl_2$; $(Y,Lu,Gd)_{2-\phi}Ca_\phi Si_4N_{6+\phi}C_{1-\phi}$ (wherein $0\le\phi\le0.5$); $(Lu,Ca,Li,Mg,Y)\alpha\text{-SiAlON}$; and/or $3.5MgO*0.5MgF_2*GeO_2$.

5. A lighting structure according to claim 1 wherein the first concentration of the non-luminescent diffuser particles adjacent the semiconductor light emitting device is greater than the second concentration of the non-luminescent diffuser particles more distant from the semiconductor light emitting device.

6. A lighting structure according to claim 1 wherein the non-luminescent diffuser particles comprise substantially spherical non-luminescent diffuser particles.

7. A lighting structure according to claim 1 wherein each of the non-luminescent diffuser particles has a width less than about 50 μm.

8. A lighting structure according to claim 1 wherein the non-luminescent diffuser particles have a refractive index of at least about 1.8.

9. A lighting structure according to claim 1 wherein each of the first and second portions of the encapsulating material comprises at least one of an epoxy, a resin, a silicone, and/or a plastic.

10. A lighting structure according to claim 9 wherein the non-luminescent diffuser particles comprise separate spaced-apart diffuser particles distributed in the encapsulating material, wherein the luminescent phosphor particles comprise separate spaced-apart luminescent phosphor particles distributed in the encapsulating material, and wherein individual ones of the non-luminescent diffuser particles are separate and spaced-apart from individual ones of the luminescent phosphor particles in the encapsulating material.

11. A lighting structure according to claim 1 wherein the phosphor host material comprises at least one of $(Ba,Sr,Ca)_5(PO_4)_3(Cl,F,Br,OH)$, $(Ba,Sr,Ca)BPO_5$, $(Sr,Ca)_{10}(PO_4)_6*\upsilon B_2O_3$ (wherein $0<\upsilon<1$), $Sr_2Si_3O_8*2SrCl_2$, $(Ca,Sr,Ba)_3MgSi_2O_8$, $BaAl_8O_{13}$, $2SrO*0.84P_2O_5*0.16B_2O_3$, $(Ba,Sr,Ca)MgAl_{10}O_{17}$, $(Ba,Sr,Ca)Al_2O_4$, $(Y,Gd,Lu,Sc,La)BO_3$, $(Ba,Sr,Ca)_2Si_{1-\xi}O_{4-2\xi}$ wherein $0\le\xi\le0.2$, $(Ba,Sr,Ca)_2(Mg,Zn)Si_2O_7$, $(Sr,Ca,Ba)(Al,Ga,In)_2S_4$, $(Y,Gd,Tb,La,Sm,Pr,Lu)_3(Al,Ga)_{5-\lambda}O_{12-3/2\lambda}$ (wherein $0\le\lambda\le0.5$), $(Lu,Y,Sc)_{2-\rho}(Ca,Mg)_{1+\rho}Li_\sigma Mg_{2-\sigma}(Si—,Ge)_{3-\sigma}P_\sigma O_{12-\rho}$ wherein $0\le\rho\le0.5$, $0\le\sigma\le0.5$, $(Ca,Sr)_8(Mg,Zn)(SiO_4)_4Cl_2$, $Na_2Gd_2B_2O_7$, $(Sr,Ca,Ba,Mg,Zn)_2P_2O_7$, $(Gd,Y,Lu,La)_2O_3$, $(Gd,Y,Lu,La)_2O_2S$, $(Gd,Y,Lu,La)VO_4$, $(Ca,Sr)S$, $SrY_2S_4$, $CaLa_2S_4$, $(Ba,Sr,Ca)MgP_2O_7$, $(Y,Lu)_2WO_6$, $(Ba,Sr,Ca)_\beta Si_\gamma N_\mu$ wherein $2\beta+4\gamma=3\mu$, $Ca_3(SiO_4)Cl_2$, $(Y,Lu,Gd)_{2-\phi}Ca_\phi Si_4N_{6+\phi}C_{1-\phi}$ wherein $0\le\phi\le0.5$, $(Lu,Ca,Li,Mg,Y)\alpha\text{-SiAlON}$, $3.5MgO*0.5MgF_2*GeO_2$, $(Ca,Sr)AlSiN_3$, $SiAlO_xN_y$, and/or $(Ba,Sr)SiO_4$.

12. A lighting structure according to claim 1 wherein the encapsulating material of the first and second portions has a refractive index of no more than about 1.6.

13. A lighting structure according to claim 11 wherein the non-luminescent diffuser particles are distributed throughout the first and second portions of the encapsulating material.

14. A lighting structure according to claim 1, wherein sidewalls of the first layer and of the semiconductor light emitting device are aligned and wherein the second layer adjoins the sidewalls of the first layer and the semiconductor light emitting device.

15. A lighting structure comprising:
    a semiconductor light emitting device configured to generate light responsive to an electrical signal applied thereto; and
    an encapsulating material configured to transmit light generated by the semiconductor light emitting device wherein the encapsulating material includes phosphor particles and yttrium aluminum garnet, YAG, diffuser particles therein, wherein the phosphor particles and the yttrium aluminum garnet, YAG, diffuser particles have different compositions, wherein a first concentration of the non-luminescent diffuser particles in a first portion of the encapsulating material adjacent the semiconductor light emitting device is different than a second concentration of the non-luminescent diffuser particles in a second portion of the encapsulating material more distant from the semiconductor light emitting device, and wherein the first and second concentrations are greater than zero;

wherein the first portion of the encapsulating material includes a first layer of encapsulating material including the phosphor particles, and wherein the second portion of the encapsulating material includes a second layer of encapsulating material including the yttrium aluminum garnet, YAG, diffuser particles, wherein the second layer of encapsulating material is substantially free of the phosphor particles.

16. A lighting structure according to claim 15 wherein the phosphor particles comprise luminescent doped yttrium aluminum garnet, YAG, phosphor particles.

17. A lighting structure according to claim 15 wherein the yttrium aluminum garnet, YAG, diffuser particles comprise substantially non-luminescent yttrium aluminum garnet, YAG, diffuser particles.

18. A lighting structure according to claim 15 wherein the first concentration of the yttrium aluminum garnet, YAG, diffuser particles adjacent the semiconductor light emitting device is greater than the second concentration of the yttrium aluminum garnet, YAG, diffuser particles more distant from the semiconductor light emitting device.

19. A lighting structure according to claim 15 wherein each of the first and second portions of the encapsulating material comprises at least one of an epoxy, a resin, a silicone, and/or a plastic.

20. A lighting structure according to claim 19 wherein the YAG diffuser particles comprise separate spaced-apart YAG diffuser particles distributed in the encapsulating material, wherein the phosphor particles comprise separate spaced-apart phosphor particles distributed in the encapsulating material, and wherein individual ones of the YAG diffuser particles are separate and spaced-apart from individual ones of the phosphor particles in the encapsulating material.

21. A lighting structure according to claim 15 wherein the encapsulating material of the first and second portions has a refractive index of no more than about 1.6.

22. A lighting structure according to claim 21 wherein the yttrium aluminum garnet, YAG, diffuser particles are distributed throughout the first and second portions of the encapsulating material.

23. A lighting structure comprising:
a semiconductor light emitting device configured to generate light responsive to an electrical signal applied thereto; and
an encapsulating material configured to transmit light generated by the semiconductor light emitting device wherein the encapsulating material includes luminescent phosphor particles and non-luminescent diffuser particles therein, wherein the luminescent phosphor particles comprise at least first and second phosphor host materials that are different from each other, and wherein the non-luminescent diffuser particles comprise at least one of the first and/or second phosphor host materials,
wherein a first concentration of the non-luminescent diffuser particles in a first portion of the encapsulating material adjacent the semiconductor light emitting device is different than a second concentration of the non-luminescent diffuser particles in a second portion of the encapsulating material more distant from the semiconductor light emitting device, and wherein the first and second concentrations are greater than zero;
wherein the first portion of the encapsulating material includes a first layer of encapsulating material including the luminescent phosphor particles, and wherein the second portion of the encapsulating material includes a second layer of encapsulating material including the non-luminescent diffuser particles, wherein the second layer of encapsulating material is substantially free of the luminescent phosphor particles.

24. A lighting structure according to claim 23 wherein each of the first and second phosphor host materials comprises at least one of $(Ba,Sr,Ca)_5(PO_4)_3(Cl,F,Br,OH)$; $(Ba,Sr,Ca)BPO_5$; $(Sr,Ca)_{10}(PO_4)_6*vB_2O_3$ wherein $0<v\leq1$; $Sr_2Si_3O_8*2SrCl_2$; $(Ca,Sr,Ba)_3MgSi_2O_8$; $BaAl_8O_{13}$; $2SrO*0.84P_2O_5*0.16B_2O_3$; $(Ba,Sr,Ca)MgAl_{10}O_{17}$; $(Ba,Sr,Ca)Al_2O_4$; $(Y,Gd,Lu,Sc,La)BO_3$; $(Ba,Sr,Ca)_2Si_{1-\xi}O_{4-2\xi}$ wherein $0\leq\xi\leq0.2$; $(Ba,Sr,Ca)_2(Mg,Zn)Si_2O_7$; $(Sr,Ca,Ba)(Al,Ga,In)_2S_4$; $(Y,Gd,Tb,La,Sm,Pr,Lu)_3(Al,Ga)_{5-\lambda}O_{12-3/2\lambda}$ wherein $0\leq\lambda\leq0.5$; $(Lu,Y,Sc)_{2-\rho}(Ca,Mg)_{1+\rho}Li_\sigma Mg_{2-\sigma}(Si\text{---},Ge)_{3-\sigma}P_\sigma O_{12-\rho}$ (wherein $0\leq\rho\leq0.5$, $0\leq\sigma\leq0.5$); $(Ca,Sr)_8(Mg,Zn)(SiO_4)_4Cl_2$; $Na_2Gd_2B_2O_7$; $(Sr,Ca,Ba,Mg,Zn)_2P_2O_7$; $(Gd,Y,Lu,La)_2O_3$; $(Gd,Y,Lu,La)_2O_2S$; $(Gd,Y,Lu,La)VO_4$; $(Ca,Sr)S$; $SrY_2S_4$; $CaLa_2S_4$; $(Ba,Sr,Ca)MgP_2O_7$; $(Y,Lu)_2WO_6$; $(Ba,Sr,Ca)_\beta Si_\gamma N_\mu$ wherein $2\beta+4\gamma=3\mu$; $Ca_3(SiO_4)Cl_2$; $(Y,Lu,Gd)_{2-\phi}Ca_\phi Si_4N_{6+\phi}C_{1-\phi}$ (wherein $0\leq\phi\leq0.5$; $(Lu,Ca,Li,Mg,Y)\alpha$-SiAlON; and/or $3.5MgO*0.5MgF_2*GeO_2$.

25. A lighting structure according to claim 23 wherein the non-luminescent diffuser particles comprise non-luminescent yttrium aluminum garnet, YAG, diffuser particles.

26. A lighting structure according to claim 23 wherein the encapsulating material comprises at least one of an epoxy, a resin, a silicone, and/or a plastic.

* * * * *

UNITED STATES PATENT AND TRADEMARK OFFICE
CERTIFICATE OF CORRECTION

PATENT NO. : 8,547,009 B2  
APPLICATION NO. : 12/500679  
DATED : October 1, 2013  
INVENTOR(S) : Hussell et al.

Page 1 of 1

It is certified that error appears in the above-identified patent and that said Letters Patent is hereby corrected as shown below:

In the Claims:
Column 15, Claim 4, Line 54: Please correct "wherein $0 \leq \upsilon \leq 1$;"
to read -- wherein $0 < \upsilon \leq 1$: --

Column 16, Claim 13, Line 50: Please correct "according to claim 11"
to read -- according to claim 12 --

Signed and Sealed this
Thirty-first Day of March, 2015

Michelle K. Lee
*Director of the United States Patent and Trademark Office*